US011959735B2

(12) United States Patent
Nakai et al.

(10) Patent No.: US 11,959,735 B2
(45) Date of Patent: Apr. 16, 2024

(54) HEIGHT MEASURING DEVICE AND BEAM IRRADIATION DEVICE

(71) Applicant: Hitachi High-Technologies Corporation, Tokyo (JP)

(72) Inventors: Naoya Nakai, Tokyo (JP); Yuichi Shimoda, Tokyo (JP); Makoto Suzuki, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 455 days.

(21) Appl. No.: 16/747,942

(22) Filed: Jan. 21, 2020

(65) Prior Publication Data

US 2020/0292298 A1    Sep. 17, 2020

(30) Foreign Application Priority Data

Mar. 11, 2019    (JP) .................................. 2019-043297

(51) Int. Cl.
*G01B 11/06* (2006.01)
*H01J 37/20* (2006.01)
*H01J 37/28* (2006.01)

(52) U.S. Cl.
CPC .......... *G01B 11/0608* (2013.01); *H01J 37/20* (2013.01); *H01J 37/28* (2013.01)

(58) Field of Classification Search
CPC ... G01B 11/0608; G01B 11/00; G01B 11/002; G01B 11/02; G01B 11/024; G01B 11/026; G01B 11/06; G01B 11/0616–0691; H01J 37/20; H01J 37/21; H01J 37/28; H01J 37/265; H01J 2237/216; H01J 2237/2482; G03F 9/70; G03F 9/7003; G03F 9/7007; G03F 9/7011; G03F 9/7019; G03F 9/7023; G03F 9/7026; G03F 9/703; G03F 9/7034; G03F 9/7061; G03F 9/7065; G03F 7/7055; G03F 7/70558–70583; G03F 7/70641;
(Continued)

(56) References Cited

U.S. PATENT DOCUMENTS 6,297,876 B1 * 10/2001 Bornebroek .............. G03F 9/70
355/53
7,599,076 B2   10/2009 Saito et al.
(Continued)

FOREIGN PATENT DOCUMENTS

JP    2002196222 A  *  7/2002 ............... G03F 7/70
JP        4426519 B2     3/2010

*Primary Examiner* — Christina A Riddle
(74) *Attorney, Agent, or Firm* — Crowell & Moring LLP

(57) ABSTRACT

An object of the present disclosure is to propose a height measuring device which performs height measurement with high accuracy at each height with a relatively simple configuration even when the sample surface height changes greatly. A height measuring device which includes a projection optical system configured to project a light ray onto an object to be measured and a detection optical system including a detection element configured to detect a reflected light ray from the object to be measured, where the projection optical system includes a light splitting element (103) which splits a trajectory of the light ray with which the object to be measured is irradiated into a plurality of parts, and thus it is possible to project a light ray to a predetermined position even when the object to be measured is located at a plurality of heights, is proposed.

19 Claims, 8 Drawing Sheets

(58) Field of Classification Search
CPC .............. G03F 7/70483; G03F 7/705; G03F 7/70605–706851
USPC .............. 356/601–613, 614–624, 625–639; 355/30, 52–55, 67–77
See application file for complete search history.

(56) References Cited

U.S. PATENT DOCUMENTS

| | | | | |
|---|---|---|---|---|
| 2002/0053634 A1* | 5/2002 | Watanabe | ............ | H01J 37/3174 250/201.2 |
| 2007/0109557 A1* | 5/2007 | Saito | ............ | H01J 37/20 356/602 |
| 2009/0208875 A1* | 8/2009 | Hidaka | ............ | G03F 9/7026 430/311 |
| 2010/0097595 A1* | 4/2010 | Sato | ............ | G03F 9/7084 355/72 |
| 2010/0129739 A1* | 5/2010 | Hidaka | ............ | G03F 9/7065 430/30 |
| 2012/0206710 A1* | 8/2012 | Niemela | ............ | G01N 21/41 356/369 |
| 2019/0323835 A1* | 10/2019 | Sekiguchi | ............ | G01C 5/00 |
| 2020/0035451 A1* | 1/2020 | Pettibone | ............ | G01N 15/0227 |

\* cited by examiner

[FIG. 1]
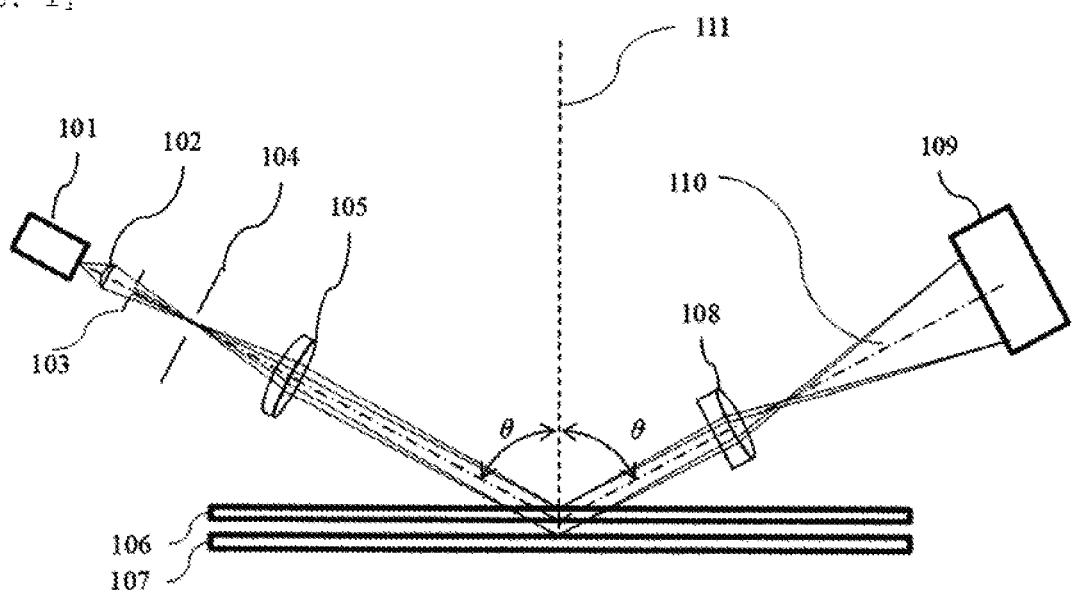
[FIG. 2]
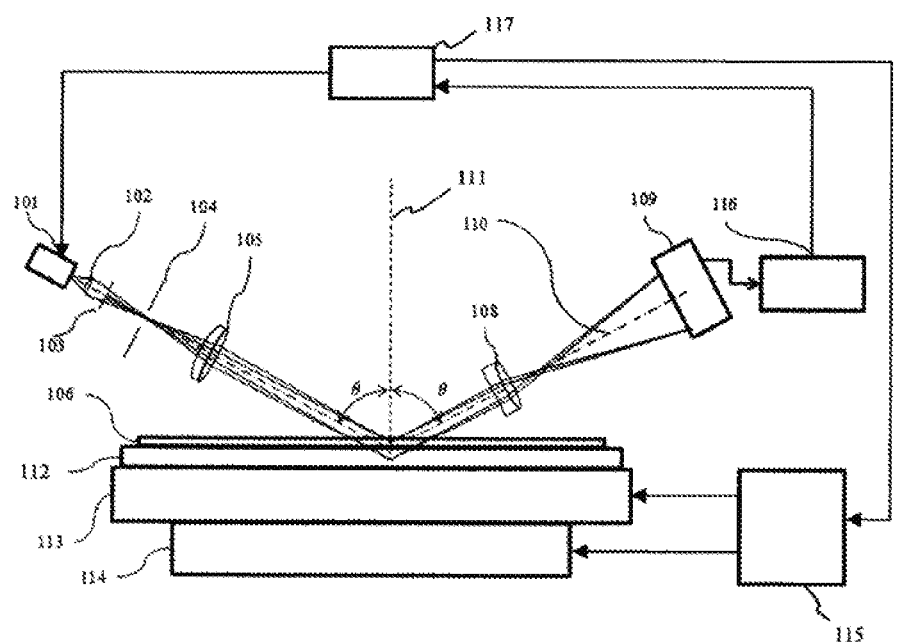

[FIG. 3]
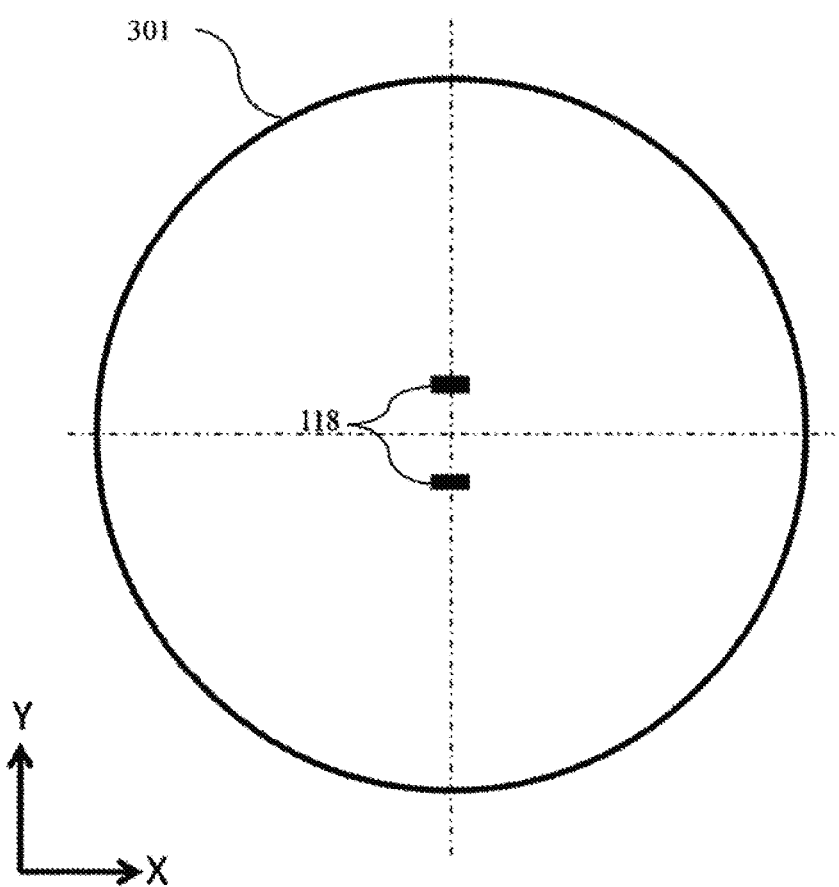
DETAILED VIEW OF SLIT

[FIG. 4]
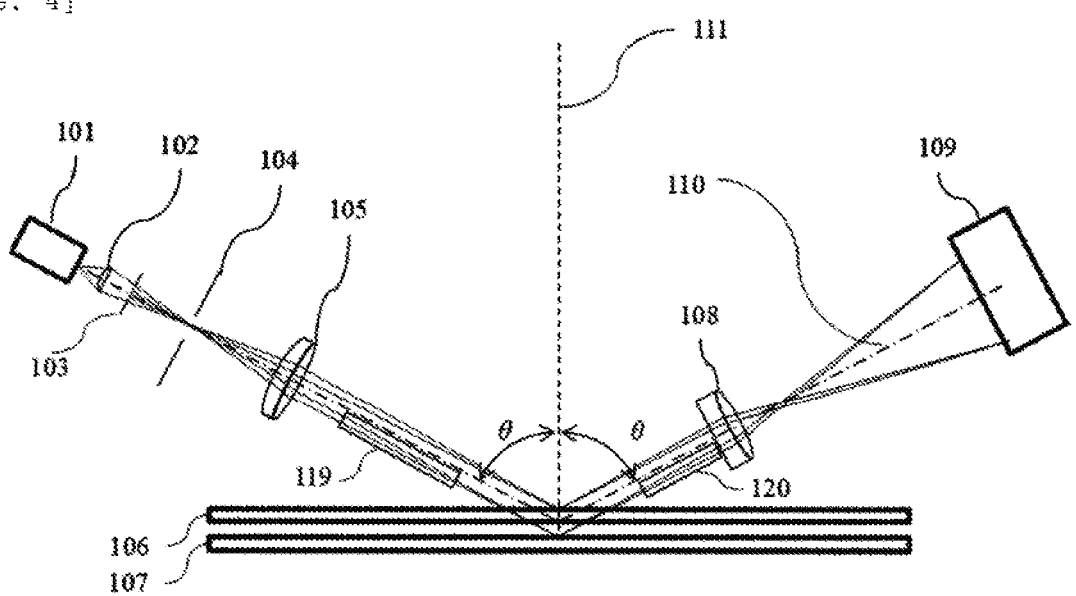
[FIG. 5]
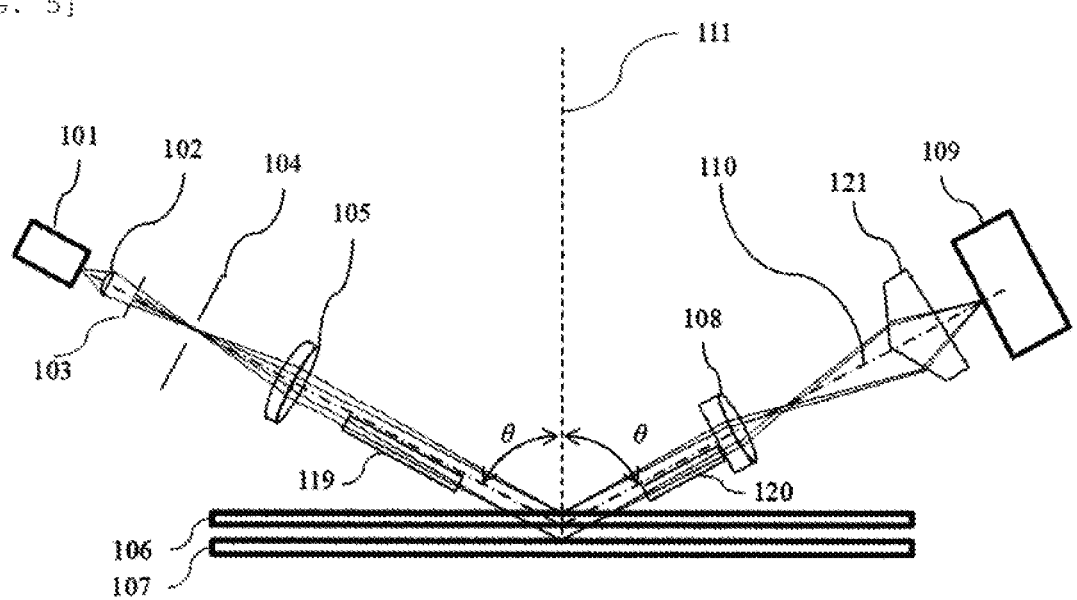

[FIG. 6]
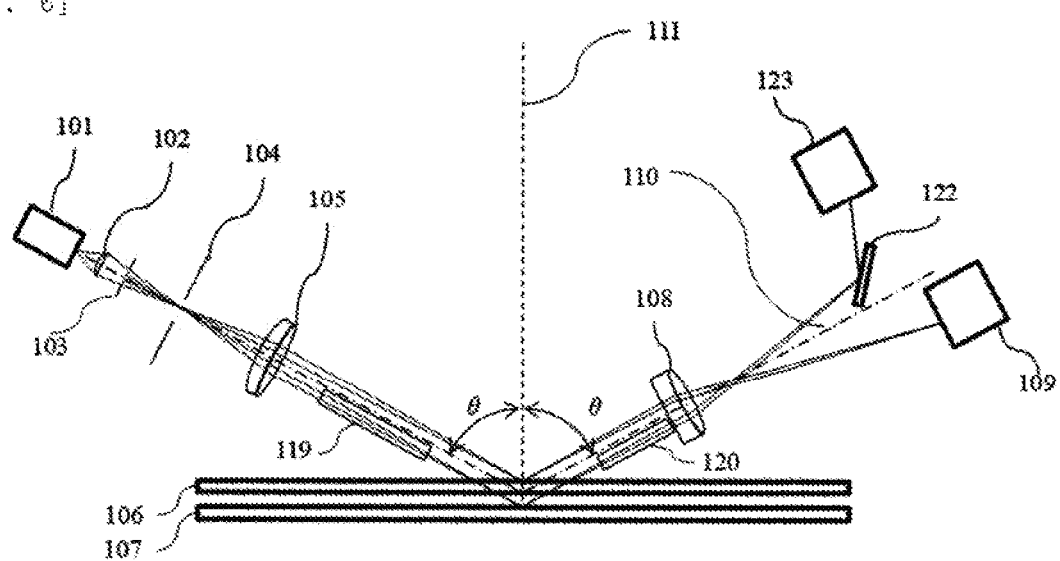
[FIG. 7]
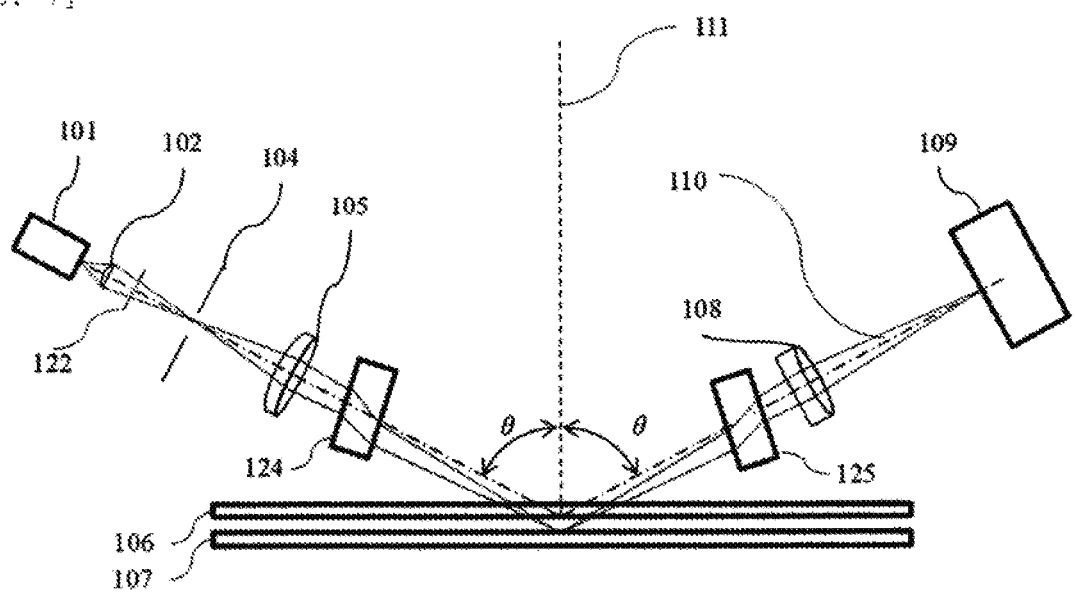

[FIG. 8]
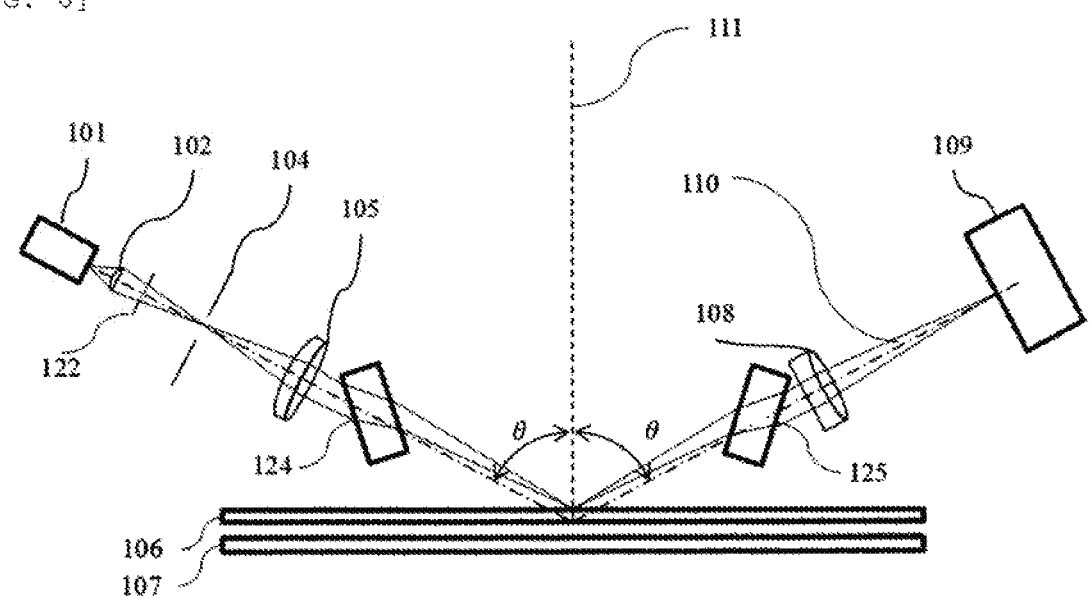

[FIG. 9]
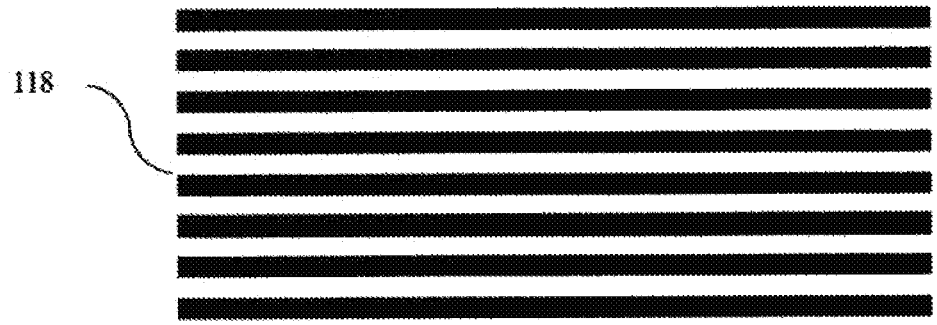
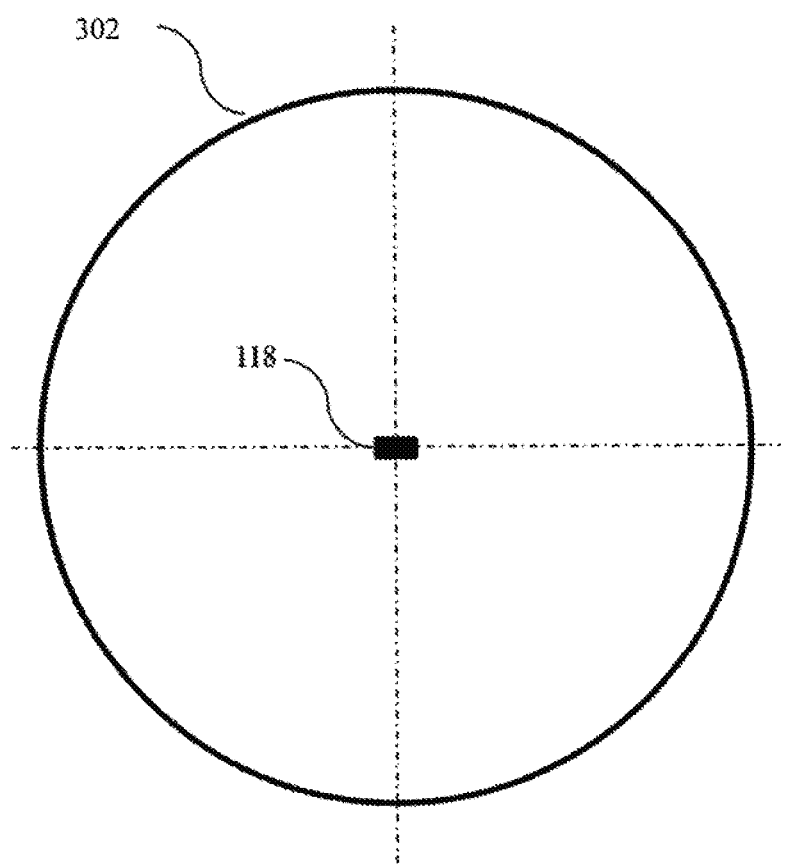

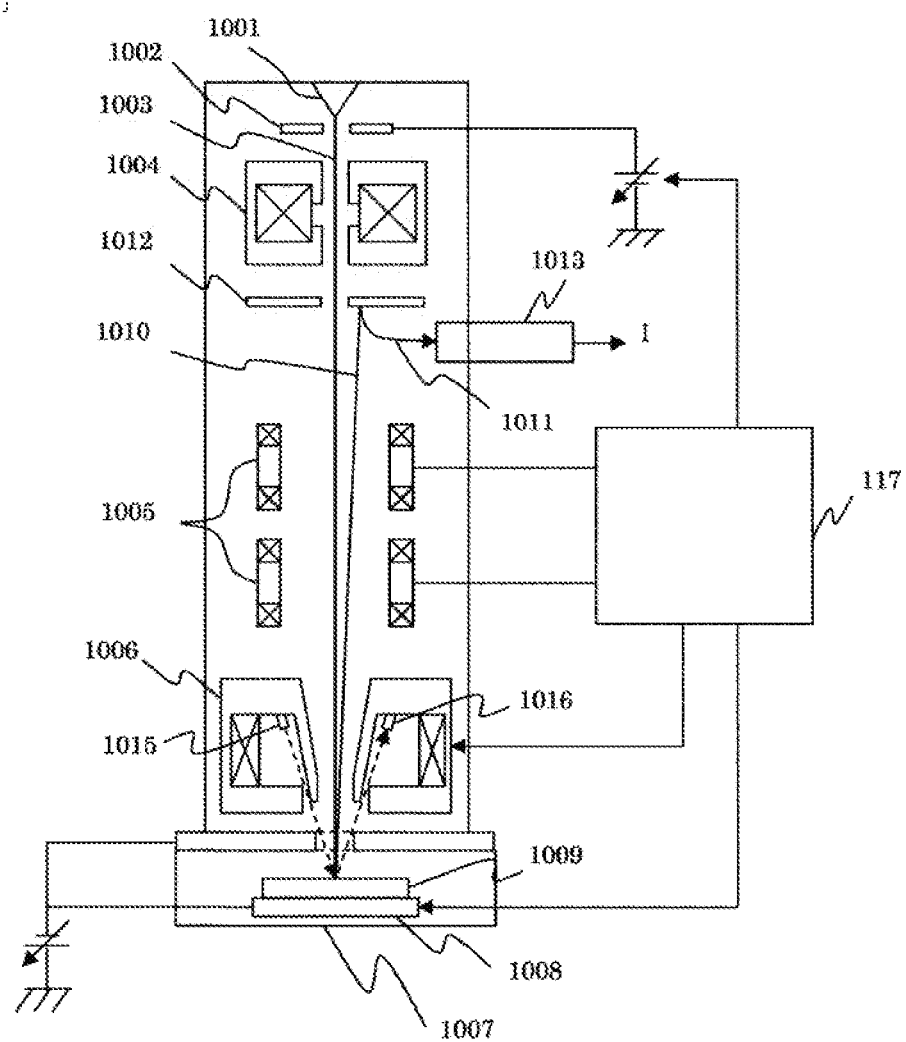
[FIG. 10]

[FIG. 11]
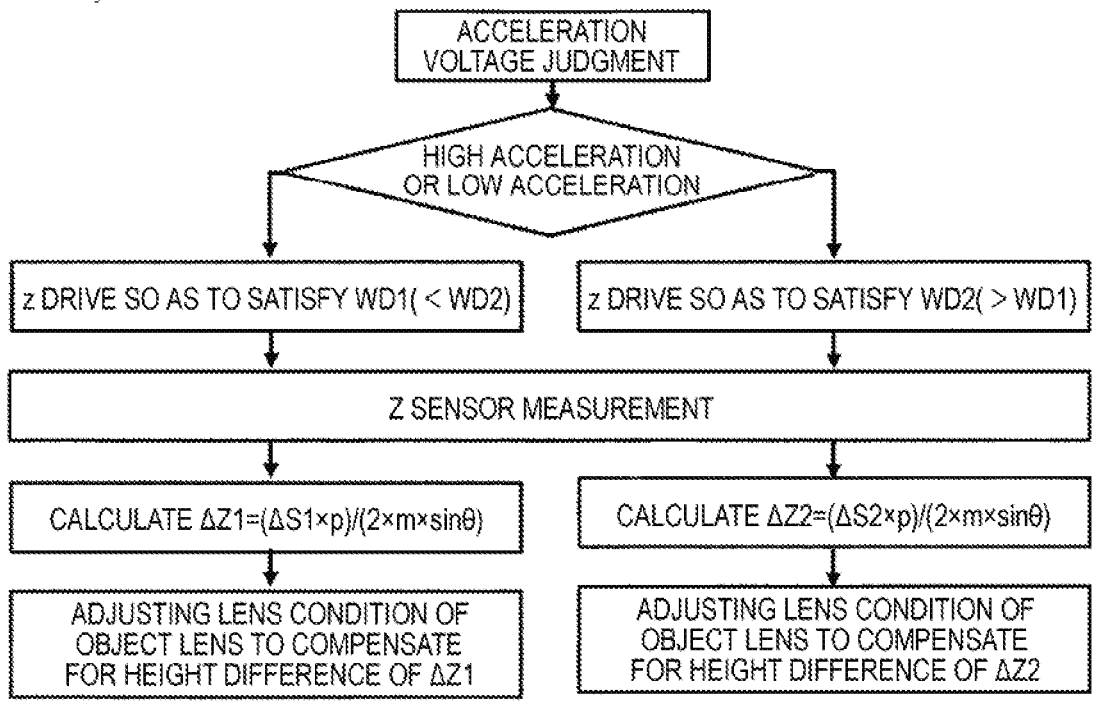

HEIGHT MEASURING DEVICE AND BEAM IRRADIATION DEVICE

CROSS REFERENCE TO RELATED APPLICATIONS

The present application claims priority from Japanese patent application JP2019-043297 filed on Mar. 11, 2019, the content of which is hereby incorporated by reference into this application.

TECHNICAL FIELD

The present disclosure relates to a height measurement device, and more particularly, to a height measurement device and a beam irradiation device which measure the height based on detection of a reflected light ray obtained when a measurement target is irradiated with a light ray.

BACKGROUND ART

Japanese Patent No. 4426519 (corresponding U.S. Pat. No. 7,599,076) discloses a height measuring device mounted on a measuring device such as a Critical Dimension-Scanning Electron Microscope (CD-SEM). Japanese Patent No. 4426519 (corresponding U.S. Pat. No. 7,599,076) discloses a height measuring device which detects the height of a measurement target object by projecting a two-dimensional slit light ray from obliquely above the measurement target object and detecting a reflected light ray of the measurement target object.

SUMMARY OF INVENTION

Technical Problem

According to a height detecting method disclosed in Japanese Patent No. 4426519 (corresponding U.S. Pat. No. 7,599,076), it is possible to capture the change in the height of a sample and adjust the device conditions so as to compensate for the change. However, due to the configuration in which a light ray is emitted from an inclined direction, when there is a large difference in height between a reference height and a sample surface, a position different from a position where the height measurement should be originally performed is irradiated with the light ray. Further, the size of a detection surface of a detector which receives a reflected light ray is limited, and thus the range in which the height can be measured with high accuracy is limited.

The following proposes a height measuring device of which an object is to measure the height with high accuracy at each height with a relatively simple configuration even when a sample surface height changes greatly.

Solution to Problem

As an aspect for achieving the object described above, a height measuring device which includes a projection optical system configured to project a light ray onto an object to be measured, a detection optical system including a detection element configured to detect a reflected light ray from the object to be measured, and a processing device configured to measure a height of the object to be measured based on an output of the detection element, where the projection optical system includes a light splitting element which splits a trajectory of the light ray with which the object to be measured is irradiated into a plurality of parts, or a beam irradiation device equipped with the height measuring device is proposed.

Further, as another aspect for achieving the object described above, a height measuring device which includes a sample stage configured to place an object to be measured, a drive mechanism for moving the sample stage in a normal line direction of a surface of the object to be measured, a projection optical system configured to project a light ray onto the object to be measured, a detection optical system including a detection element configured to detect a reflected light ray from the object to be measured, and a processing device configured to measure a height of the object to be measured based on an output of the detection element, where the projection optical system includes a switching element configured to switch a trajectory of the light ray with which the object to be measured is irradiated, and the switching element is configured to switch the trajectory of the light ray so as to make a position of an irradiation point of a light ray when the object to be measured is positioned at a first height coincide with a position of an irradiation point of a light ray with respect to the object to be measured when the object to be measured is positioned at a second height different from the first height with the drive mechanism, or a beam irradiation device equipped with the height measuring device is proposed.

Advantageous Effects of Invention

According to the configuration described above, even when the sample height changes greatly, the height can be measured with high accuracy at each height.

BRIEF DESCRIPTION OF DRAWINGS

FIG. 1 is a view illustrating an example of a height measuring device including a light splitting element which splits a light ray into a plurality of light paths.

FIG. 2 is a view illustrating an example of the height measuring device which measures the height of an object to be measured placed on a Z stage.

FIG. 3 is a view illustrating an example of the light splitting element.

FIG. 4 is a view illustrating an example of a height measuring device including a light splitting element which splits a light ray into a plurality of optical paths and an adjustment element which matches a focusing condition of one divided optical path with another optical path.

FIG. 5 is a view illustrating an example of a height measuring device including a light splitting element which splits a light ray into a plurality of optical paths and including an element which focuses a plurality of reflected light trajectories at one position of a detection element.

FIG. 6 is a view illustrating an example of a height measuring device including a light splitting element which splits a light ray into a plurality of optical paths and including a plurality of detection elements.

FIG. 7 is a view illustrating an example of a height measuring device including a switching element which switches a light trajectory.

FIG. 8 is a view illustrating an example of a height measuring device including a switching element which switches a light trajectory.

FIG. 9 is a view illustrating an example of a two-dimensional slit used in the height measuring device.

FIG. 10 is a view illustrating an example of a scanning electron microscope provided with the height measuring device.

FIG. 11 is a flowchart illustrating a process of adjusting the height of an object to be measured in accordance with the acceleration voltage and measuring the height of the object to be measured after the adjustment with the height measuring device.

DESCRIPTION OF EMBODIMENTS

In CD-SEM or SEM type inspection equipment used to measure fine pattern widths and hole diameters in a semiconductor manufacturing process, when the focus of the electron beam is not on the sample, the apparent pattern width and hole diameter change, and thus correct length measurement will not be possible. Further, in defect detection by pattern comparison, there is a risk that a correct pattern is erroneously detected as a defect. Therefore, focusing of the electron beam is important. However, in automatic focus control which automates general focusing, the focal position of an objective lens is changed and an electron beam image is detected at each point, and then the in-focus position is detected from the electron beam image. As a result, auto focusing takes time.

Throughput is also an important performance index for the CD-SEM or SEM type inspection equipment used in semiconductor manufacturing processes. When focus adjustment is performed only by automatic focusing using image processing or the like, a corresponding time is required, which is not preferable. Therefore, by mounting an optical height measurement device on a CDSEM or the like, the approximate height of a sample is measured and a lens is controlled so that the height is in focus, in such a manner that it is desirable to minimize the amount of focus variation during automatic focus adjustment.

The optical height measuring instrument is inferior in accuracy to the automatic focusing of the electron beam using image processing or the like, but is excellent in terms of measurement time. That is, when the measurement accuracy of the optical height measuring instrument can be improved, it can contribute to the improvement of the throughput of the CD-SEM device or the SEM type inspection device.

When an oblique projection and oblique detection type optical height measuring device is used as the height measuring device, the irradiation position on the sample changes when the height fluctuation amount of the sample (wafer) increases. For example, in a case of a device which measures the height of the electron beam irradiation position with high accuracy by making the electron beam irradiation position the same as the light projection position of the optical height measuring device, when the sample height changes significantly, the light irradiation position deviates from the electron beam irradiation position and the height measurement for adjusting the focus of the electron beam will not be performed properly. In addition, in a case of a detection optical system which displaces and expands the light ray reflected by a sample surface with an expansion optical system, when the variation in height is large, the arrival position of the light ray on a sensor surface also changes greatly. As a result, a large sensor is required.

The following describes a height measuring device which realizes a wafer movement amount in millimeters while maintaining a measurement accuracy of hundreds of nanometers with a simple optical system, having low cost, high accuracy, and practical detection speed.

the examples below describe a height measuring device in which a light ray (for example, a two-dimensional slit image) is projected from a direction (in a case of a scanning electron microscope, a direction inclined from an electron beam optical axis) inclined with respect to an object (sample surface) and the reflected light obtained as a result of reflection of the projected light from the object is detected, and further the projected image of the detected light ray is converted into an electric signal by a two-dimensional area sensor or the like, and then the height is detected by calculation from the electric signal.

Furthermore, the following example describes a height measuring device in which a projection optical system includes a light splitting element (for example, an opening forming member provided with a plurality of openings including a plurality of slits) which splits a light ray into a plurality of optical paths and which of the reflected light rays of the divided lights is selected to be used for height measurement according to the sample height.

Also, the light ray split by the splitting element provided in the projection optical system is split on the premise that different sample heights are irradiated with the split light ray, and thus the optical path length (distance from a light source to the sample) changes. Therefore, a height measuring device provided with an adjustment element for matching the condition of the other optical path with one optical path to make the condition of the divided light ray uniform will be described.

Furthermore, a height measuring device provided with a switching element which switches the trajectory of light rays so that an irradiation point of the light ray to the sample is maintained between when the sample is located at a first height and when the sample is located at a second height different from the first height will be described.

A height measuring device which includes a slit forming member in which a plurality of two-dimensional slits in which a plurality of slits are periodically arranged are formed and splits a light ray into a plurality of parts by selectively allowing the light ray to pass through the plurality of two-dimensional slits by projecting the light ray onto the plurality of two-dimensional slits will be described.

According to the configuration described above, height detection can be performed with a resolution of several tens of nanometers in a measurement range of several hundreds of micrometers with respect to a plurality of sample reference heights separated by millimeters.

By arranging a plurality of periodic slits according to a plurality of sample reference heights separated by millimeters, with a simple structure, an optical height detector capable of measuring heights with a resolution of several tens of nanometers at a plurality of sample reference heights separated by millimeters can be configured.

In the examples described below, an example in which the reference height is two will be described. However, the reference height may be three or more and the optical path may be divided into three or more.

Example 1

FIGS. 1 to 3 are views for illustrating a height measuring device provided with a dividing element which divides a light ray emitted from a light source into a projection optical system so as to correspond to different sample heights. The height measuring device is provided with a light source 101, and a light ray emitted from the light source 101 passes through a lens 102 and is condensed at a position of a diaphragm 104 through a double multi-slit 103 (a plurality of two-dimensional slits) described below.

The double multi-slit 103 is provided to divide the light trajectory into a plurality (two in this embodiment) of parts. FIG. 3 is a view illustrating an example of the double multi-slit. In this example, two multi slits 118 in which a plurality of single slits are arranged are formed on a slit forming member 301 having a circular shape. By selectively allowing the light ray irradiated to the slit forming member 301 to pass through the two multi-slits 118 (two openings), the optical path is divided into a plurality of parts.

A plurality of light rays which have passed through the diaphragm 104 are collected by a projection lens 105 and their trajectories are changed so that the trajectories of the two light rays are parallel to each other and irradiated on the sample. The projection lens 105 not only collects the light rays on the sample, but also unifies the directions of the divided light rays, in such a manner the projection lens 105 adjusts the trajectory so that the same position is irradiated with the light rays even when the samples have different heights. For example, when the height measuring device illustrated in FIG. 1 is mounted on a scanning electron microscope, whether the object to be measured is at either a first reference height 106 or a second reference height 107, it is configured to irradiate a point that intersects an ideal optical axis 111 of the electron beam. That is, even when the heights are different, the optical path is divided so that the irradiation positions of the light rays to the object to be measured match.

The light rays whose trajectory is adjusted by the projection lens 105 is incident obliquely on the object to be measured at the first reference height 106 or the object to be measured at the second reference height 107, and then the incident light ray forms an image of one multi-slit of the double multi-slits near a surface of the object to be measured at the first reference height 106 or the object to be measured at the second reference height 107.

The two-dimensional slit image reflected from the surface of the object to be measured at the first reference height 106 or the object to be measured at the second reference height 107 is re-imaged on the surface of a two-dimensional image sensor element (detection element) 109 by a detection lens 108 included in a detection optical system.

FIG. 2 is a view illustrating an example of a system including a stage mechanism for moving the object to be measured and a height measuring device for the object to be measured. FIG. 2 illustrates, for example, a part of the configuration mounted on a scanning electron microscope. The object to be measured at the first reference height 106 is mounted on a stage mechanism including a sample suction mechanism 112 such as an electrostatic chuck, an X-Y stage 113, and a Z stage 114. The Z stage 113 incorporates a drive mechanism for moving the object to be measured in the direction of the ideal optical axis 111 of the electron beam.

A control device 117 controls the light source 101 to emit a light ray from the light source 101 toward the sample and controls a stage drive power supply 115 so as to move the X-Y stage 113 and the Z stage 114 based on preset conditions.

An optical path 110 illustrated in FIG. 2 is set so as to intersect with the ideal optical axis 111 of the electron beam. Also, the light ray passing through the optical path 110 is divided into two by the double multi-slit 104 and the trajectory of the light ray is bent by the projection lens 105, and then the light ray passes through the trajectory parallel to the optical path 110 and is projected onto the object to be measured. It is configured such that one of the two divided light rays intersects with the ideal optical axis 111 of the electron beam on the surface of the object to be measured when the object to be measured is located at the first reference height 106 and the other light ray intersects with the ideal optical axis 111 of the electron beam on the surface of the object to be measured when the object to be measured is located at the second reference height 107.

The two-dimensional imaging sensor 109 is installed at a position where the reflected light from the object to be measured is received and detects a change in the position where the reflected light reaches. The output (electric signal) of the two-dimensional imaging sensor 109 is transmitted to a height arithmetic processing unit 116, and based on an arithmetic expression described below, the lens condition (excitation current, applied voltage, DAC value, and the like) of an object lens of an electron microscope is calculated based on a parameter indicating the relative change from the height of the object to be measured or the reference height. Equation 1 is stored in advance in a predetermined storage medium. The output of the height arithmetic processing unit 116 is transmitted to the control device 117 and the control device 117 controls the lens based on the obtained height information or the lens condition.

The height arithmetic processing unit 116 calculates a relative height ΔZ with respect to the reference height based on the arithmetic expression illustrated in Equation 1.

$$\Delta Z = \frac{\Delta S \times p}{2m \times \sin\theta} \quad \text{[Equation 1]}$$

In the equation, θ is the relative angle (incident angle) of the optical path 110 with respect to an electron beam optical axis 111 (normal line to the surface of the object to be measured) and ΔS is the amount of movement of the center of gravity coordinate of the slit image reaching the detection surface of the two-dimensional imaging sensor 109 with respect to the reference position. Further, p is the pixel size of the pixels included in a two-dimensional area sensor 109 and m is the imaging magnification of the imaging optical system after being reflected by the object to be measured. In this example, an example using a two-dimensional area sensor in which a plurality of pixels are arranged in a matrix has been described. However, a plurality of one-dimensional line sensors may be arranged to form the two-dimensional sensor.

In this example, the height is measured at each of the first reference height and the second reference height. Therefore, at least two reference heights (reference positions on the sensor (detection element)) are set in advance and the relative height is obtained from the difference (movement amount).

In a length measurement or inspection device using an electron beam, high accuracy in height measurement is required in order to obtain a more stable high-quality image. Also, there is a need to observe the internal structure of the sample by highly accelerating the electron beam. For example, as the energy (acceleration energy) of the electron beam reaching the sample is higher, the electron beam reaches the inside of the sample, and thus information that cannot be seen from the sample surface can be visualized. In addition, high resolution is required for a device which performs length measurement and inspection using an electron beam. In order to increase the resolution of the electron beam device, it is desirable to shorten the distance (working distance: WD) between the sample surface and the object lens.

However, the object lens converges the electron toward the ideal optical axis and focuses the beam, so that the higher the beam acceleration, the stronger the convergence action is required. Also, when the working distance is short, it is necessary to converge the electrons at a short distance, so that a strong convergence action is still necessary, and it is difficult to achieve both shortening of the working distance and high energy of the beam.

Therefore, this example describes an electron beam device which controls the position of the stage in the height direction so that the working distance is shortened by giving priority to resolution during measurement and inspection using a low-energy beam and the working distance is lengthened by giving priority to the action of converging electrons during measurement and inspection using a high-energy beam.

FIG. 10 is a schematic configuration diagram of a scanning electron microscope which is an example of a charged particle beam apparatus. The scanning electron microscope is mainly constituted of an electron beam column which is abeam irradiation optical system, a vacuum sample chamber 1007 for maintaining the atmosphere of the object to be measured in a vacuum state, and the control device 117 for controlling optical elements included in the electron beam column to be described below. An electron beam extracted from an electron source 1001 by an extraction electrode 1002 and accelerated by an acceleration electrode (not illustrated) is incident on a condenser lens 1004, which is a form of a focusing lens, along the ideal optical axis 1003 of the beam and focused, and then the electron beam is scanned one-dimensionally or two-dimensionally on a sample 1009 by a scanning deflector 1005. The electron beam is decelerated by the negative voltage applied to the electrode built in a sample stage 1008 and is focused by the lens action of an object lens 1006 and irradiated onto the sample 1009.

When the sample 1009 is irradiated with the electron beam, secondary electrons and electrons 1010 such as backscattered electrons are emitted from the irradiated portion. The emitted electrons 1010 are accelerated in a direction of the electron source by an acceleration action based on a negative voltage applied to the sample and collide with a conversion electrode 1012 to generate secondary electrons 1011. The secondary electrons 1011 emitted from the conversion electrode 1012 are captured by the detector 1013 and an output I of the detector 1013 changes depending on the amount of captured secondary electrons. Depending on the output I, the brightness of a display device (not illustrated) changes. For example, when a two-dimensional image is formed, an image of the scanning region is formed by synchronizing the deflection signal to the scanning deflector 1005 with the output I of the detector 1013. The scanning electron microscope illustrated in FIG. 10 includes a deflector (not illustrated) which moves the scanning region of the electron beam.

The example of FIG. 10 demonstrates an example which converts the electron discharged from the sample once by the conversion electrode and detects it. However, needless to say, it is not limited to such a configuration. For example, it is also possible to adopt a configuration in which a detection surface of an electron multiplier tube or a detector is arranged on an accelerated electron trajectory. The control device 117 controls each component of the scanning electron microscope and includes a function of forming an image based on detected electrons and a function of measuring a pattern width of a pattern formed on the sample based on a detected electron intensity distribution called a line profile.

Further, the electron beam apparatus illustrated in FIG. 10 includes a height measuring device including the light source 1015 and a light receiving element 1016. This height measuring device is the same as that illustrated in FIG. 2, for example. A sample chamber 1007 incorporates an x-y drive mechanism for moving the sample stage 1008 on which a sample (object to be measured) is placed in an x-y direction and a z drive mechanism for moving the sample stage 1008 in a z direction. Those drive mechanisms are controlled by a control signal supplied from the control device 117.

An optical element constituting the height measuring device is installed such that the beam trajectory of the projection optical system of the height measuring device and the beam trajectory of the detection optical system are mirror-symmetric with respect to a virtual plane including the ideal optical axis 1003.

Furthermore, the control device 117 controls the z drive mechanism based on the output of the height measuring device and also controls the excitation current of the object lens 1006 based on the output of the height measuring device (Z sensor). The control device 117 controls the lens condition (excitation current) of the object lens 1006 based on the relationship information between the output of the height measuring device stored in advance and the control signal of the object lens 1006.

FIG. 11 is a flowchart illustrating a process of controlling the scanning electron microscope so as to perform stage control and height measurement according to set beam conditions (acceleration voltage or energy reaching the sample of the beam). First, the control device 117 reads a condition such as an acceleration voltage set in advance by an operation program (recipe) or the like. Then, when low acceleration is set, the z drive mechanism is controlled so that WD1(<WD2) is satisfied, and when high acceleration is set, the z drive mechanism is controlled so that WD2 (>WD1) is obtained. Here, the determination of high acceleration or low acceleration may be determined by a preset threshold value. Alternatively, it may be performed such that identification information indicating whether the acceleration is high or low is be given in advance to a specific acceleration voltage and the determination may be made based on the identification information. Further, the working distance or the sample height (for example, a difference in height between a predetermined reference position and the sample surface) may be directly set and the z drive mechanism may be controlled based on the setting.

Next, height measurement using a Z sensor is performed. In this case, when WD1 is set in the recipe, $\Delta Z1=(\Delta S1 \times p)/(2 \times m \times \sin \theta)$ is calculated as a value related to the sample height, and when WD2 is set in the recipe, the difference between the sample surface height and the reference height is obtained by calculating $\Delta Z2=(\Delta S2 \times p)/(2 \times m \times \sin \theta)$. S1 is the difference (difference in the center of gravity of the slit image) between the reference position on the two-dimensional imaging sensor and the actual light arrival position when the object to be measured is positioned at the first reference height 106 and S2 is the difference between the reference position on the two-dimensional imaging sensor and the actual light arrival position when the object to be measured is positioned at the second reference height 107. As illustrated in FIG. 1, when the object to be measured is positioned at the first reference height 106 and when the object to be measured is positioned at the second reference height 107, the arrival position of the reflected light ray with respect to the two-dimensional imaging sensor 109 is different. Therefore, a reference position is set for each height.

In this example, although an example of performing the calculation using the arithmetic expression described above is described, a table indicating the relationship between $\Delta Z$ and $\Delta S$ may be created in advance and $\Delta Z$ may be output by referring to the table. The control device 117 specifies the lens condition using a relational expression between $\Delta Z$ and the lens condition of the object lens, or a table, and controls the object lens 1006.

In addition, the arithmetic expression or table which shows the relationship between, instead of $\Delta Z$, $\Delta$Obj (difference in excitation current (beam focusing condition) of the object lens) and $\Delta S$ is prepared and the excitation current of the object lens may be adjusted based on the input of $\Delta S$.

In a case of an apparatus which adjusts the focus by controlling the z drive mechanism, the z drive mechanism may be controlled to cancel the $\Delta Z$ described above. Alternatively, an arithmetic expression or table showing the relationship between $\Delta S$ and the stage movement amount may be prepared and the z drive mechanism may be controlled using these information.

In this example, a scanning electron microscope is described as an example of a type of beam irradiation apparatus, but application to an optical inspection apparatus or the like is also possible. In particular, the invention can be applied to a case where a sample having a large difference in height is measured, or to various apparatuses including a z stage which moves an object to be measured in the z direction as necessary as described above.

FIG. 4 is a view illustrating an example in which correction elements for unifying optical conditions between an optical system (first irradiation optical system) for irradiating a light ray to the object to be measured positioned at first reference height 106 and a detection optical system (first detection optical system) for detecting a reflected light ray, and a correction element for unifying optical conditions are respectively installed in the optical system (second irradiation optical system) for irradiating a light ray to the object to be measured positioned at the second reference height 107 and the detection optical system (second detection optical system) for detecting the reflected light ray.

In a case of the height measuring device illustrated in FIG. 1, it is possible to divide the optical path into two and irradiate the same part (electron beam irradiation point) in the same direction even at different heights. However, the optical path length between the projection lens 105 and the object to be measured and the optical path length between the object to be measured and the detection lens 108 are different. That is, when the projection lens 105 is focused on the surface of the object to be measured positioned at the first reference height 106, the surface of the object to be measured positioned at the second reference height is not focused.

FIG. 4 is a view illustrating an example in which an adjustment element for adjusting the focal position is installed in the optical path of the second irradiation optical system in order to enable the focal point of the projection lens 105 to be appropriately positioned also on the object to be measured at the second reference height 107. The adjustment element is, for example, a glass member whose light incident surface and light emission surface are both flat. By inserting the glass member, the focal position can be positioned farther than when the glass member is not inserted.

By inserting the glass member having flat ends (incident surface and emission surface), the position where the light ray is focused can be changed by the refractive effect of the glass.

In the configuration illustrated in FIG. 4, by inserting a glass 119 on the light source side with respect to the object to be measured at the second reference height 107, the position where the image of the double multi-slit 103 is formed and the position of the surface of the object to be measured at the second reference height 107 can be matched. More specifically, by inserting an element (element which extends the optical path) which extends the focal length by the amount of Opt_ext1 into the optical path with respect to the first irradiation optical system, the focusing conditions of the two irradiation optical systems can be matched. As a result, highly accurate height measurement can be performed regardless of the set height of the object to be measured. The Opt_ext1 can be obtained by Equation 2. |WD1−WD2| is a difference (WD) between the first height and the second height.

$$Opt_{ext1} = \frac{|WD1 - WD2|}{\cos\theta} \qquad \text{[Equation 2]}$$

Similarly to the irradiation optical system, the distance between the object to be measured and the detection lens 108 is different between the first detection optical system and the second detection optical system. Therefore, regardless of the set height of the object to be measured, in order to make the reflected light ray enter the detection lens 108 under the same conditions, as a correction element, a glass 120 is disposed between the object to be measured of the second detection optical system and the detection lens 108. Further, since the second detection optical system has a longer distance between the object to be measured and the detection lens 108 than the first detection optical system by the length obtained by Equation 2, a correction element which makes the imaging state of the second detection optical match the imaging state of the first detection optical system is employed.

After being reflected by the object to be measured at the second reference height 107, by inserting a glass 120 in relation to the detection lens 108, both the light ray reflected by the object to be measured at the first reference height 106 and the light ray reflected by the object to be measured at the second reference height 107 can be imaged on the surface of the two-dimensional image sensor element 109 in focus at the same time.

Here, the glass 119 and the glass 120 may have smooth flat surfaces with both ends (light incident surface and light emission surface) being parallel and may have any shape such as a plate, a column, or a block. Further, the lengths of the glass 119 and the glass 120 in the optical path direction are not necessarily the same. Since the length corresponds to the correction amount of the imaging position, the glass 120 is shorter than the glass 119.

FIG. 5 is a view illustrating an example of a height measuring device including an element for focusing the light trajectories of the first detection optical system and the second detection optical system on one place on the two-dimensional image sensor element 109. In a case of the height measuring device illustrated in FIG. 1 or the like, since the position of the light ray reaching the two-dimensional image sensor element 109 is different between the case where the object to be measured exists at the first reference height 106 and the case where the object to be measured exists at the second reference height 106, a detection surface having a size that covers the arrival positions of the two light rays is required. On the contrary, according to the configuration illustrated in FIG. 5, by providing an element for condensing two light trajectories at one point on the detection surface or close to it, between the object to be measured and the two-dimensional image sensor element 109, even a two-dimensional image sensor element having a small detection surface can detect light rays reflected at different set heights.

Specifically, a double-sided wedge substrate 121 formed with incident surfaces (a plurality of inclined surfaces) which refract a plurality of light rays toward a position on the detection surface of the two-dimensional image sensor element 109 that intersects the optical path 110 is disposed between the detection lens 108 and the two-dimensional image sensor element 109 as a light collecting element.

In this way, by inserting the double-sided wedge substrate 121 having a flat surface on one side and two angles on the other side into the optical path, the light is refracted. As a result, the image can be formed at the same position or close positions on the surface of the two-dimensional image sensor element 109. This makes it possible to perform height measurement at a plurality of set heights even with a two-dimensional image sensor element having a detection surface of a limited size.

FIG. 6 is a view illustrating an example in which two two-dimensional image sensor elements are provided. In the example of FIG. 6, by arranging a mirror 122 on one optical path (in FIG. 6, on the trajectory of the reflected light reflected from the object to be measured at the second reference height 107), the reflected light ray from the object to be measured is further reflected, and thus the reflected light ray reaches the two-dimensional image sensor element 123 which is spaced apart from the original optical path. With this configuration, it is possible to perform highly accurate height measurement at a plurality of set heights without increasing the detection surface of the two-dimensional image sensor element 109.

Example 2

Next, a height measuring device having an irradiation optical system and an incident optical system for switching the light trajectory between when the object to be measured is positioned at the first reference height 106 and when the object to be measured is positioned at the second reference height will be described. In this embodiment, instead of the double multi-slit illustrated in FIG. 1 or the like, a slit forming member 302 in which one multi-slit 118 as illustrated in FIG. 9 is formed is installed in the irradiation optical system as a multi-slit 122 illustrated in FIGS. 7 and 8.

The light rays emitted from the light source 101 are converged by the lens 102 and enters the multi-slit 122. The light ray that has passed through the multi-slit 122 is collected at the passage aperture of the diaphragm 104 and further converged by the lens 105 to reach the object to be measured at the first reference height 106 or the object to be measured at the second reference height 107.

A thick glass plate 124 (light trajectory adjusting element) which is one of switching element that switches the light trajectory and changes the light trajectory from the optical path 110 is provided between the object to be measured and the lens 105. By providing the optical trajectory adjusting element with a rotation mechanism (not illustrated) and controlling the rotation mechanism in accordance with the reference height setting by the control device 117, the light trajectory is switched so that an appropriate position is irradiated with the light ray (for example, the point of the object to be measured irradiated with the electron beam) when (FIG. 8) the object to be measured is positioned at the first reference height 106 and when (FIG. 7) the object to be measured is positioned at the second reference height 107. By using a thick glass plate or the like, it is possible to adjust the light trajectory using the light refraction action.

Further, by arranging an optical trajectory adjusting element which returns the light trajectory to the original optical path 110 between the object to be measured and the detection lens 108, even with the two-dimensional image sensor element 109 having a small detection surface, it is possible to measure the height of an object to be measured having a plurality of set heights. In the configuration illustrated in FIGS. 7 and 8, a thick glass plate 125 supported by a rotation mechanism is also arranged in the detection optical system as well as the irradiation optical system and the control device 117 adjusts the angle of the thick glass plate 125 in conjunction with the glass plate 124 so as to change the light trajectory so that the light trajectory changed by the thick glass plate 124 is returned to the original state. Thereby, the shift of the light beam due to the change in the height of the object to be measured is canceled and an image is formed at the center of the surface of the two-dimensional image sensor element 109. Accordingly, the height can be measured using one two-dimensional image sensor element regardless of the height of the object to be measured.

In this embodiment, the thick glass plate 124 and the thick glass plate 125 may have the same thickness or different thicknesses. However, in order to correct the deviation of the irradiation position of the light ray reflected from the object to be measured at the second reference height 107, it is desirable that the thicknesses of the thick glass plate 124 and the thick glass plate 125 are the same.

Further, the detection optical system may be configured as illustrated in FIGS. 5 and 6.

REFERENCE SIGNS LIST

101: light source
102: lens
103: double multi-slit
104: diaphragm
105: projection lens
106: first reference height
107: second reference height
108: detection lens
109: two-dimensional image sensor element
110: optical path
111: ideal optical axis of beam (normal line)
112: sample suction mechanism
113: X-Y stage
114: Z stage
115: stage drive power supply
116: height arithmetic processing unit
117: control device
118: multi-slit
119: glass member
120: glass member
121: double-sided wedge substrate
122: mirror
123: second two-dimensional image sensor element
124: thick glass plate
125: thick glass plate

The invention claimed is:

1. A height measuring device, comprising:
a projection optical system configured to project a light ray onto an object to be measured;
a detection optical system including a detection element configured to detect a reflected light ray from the object to be measured;
a processing device configured to measure a height of the object to be measured based on an output of the detection element;
an adjustment element disposed lengthwise along a projection direction of the light ray projected by the projection optical system and between the projection optical system and the object to be measured, and including a smooth flat light incident surface and a smooth flat light emission surface which are parallel to each other; and
a correction element disposed lengthwise along a direction of the reflected light ray reflected from the object to be measured and between the object to be measured and the detection optical system, and including a smooth flat light incident surface and a smooth flat light emission surface which are parallel to each other, wherein
a length of the adjustment element is longer than a length of the correction element,
the projection optical system includes a light splitting element which splits a trajectory of the light ray with which the object to be measured is irradiated into a plurality of parts, and
the detection optical system includes a double-sided wedge substrate configured to focus a plurality of trajectories of the light ray into one point on the detection element, the double-sided wedge substrate including a first surface through which a first trajectory of the light ray is transmitted and a second surface, different from the first surface, through which a second trajectory, different from the first trajectory, of the light ray is transmitted.

2. The height measuring device according to claim 1, wherein
the projection optical system includes a light source configured to emit light rays, and the light splitting element is an opening forming member in which an opening for selectively passing a part of the light rays emitted from the light source is formed and which has a plurality of openings for dividing the trajectory of the light ray into a plurality of parts.

3. The height measuring device according to claim 2, wherein
the opening is a two-dimensional slit in which a plurality of slits are arranged.

4. The height measuring device according to claim 2, wherein
the projection optical system is configured such that a position of an irradiation point of a light ray with respect to the object to be measured when the object to be measured is arranged at a first height coincides with a position of an irradiation point of a light ray with respect to the object to be measured when the object to be measured is arranged at a second height different from the first height.

5. The height measuring device according to claim 4, wherein
the projection optical system includes a projection lens which changes the trajectory of the divided light ray so that a position of an irradiation point of a light ray with respect to the object to be measured when the object to be measured is arranged at a first height coincides with a position of an irradiation point of a light ray with respect to the object to be measured when the object to be measured is arranged at a second height different from the first height.

6. The height measuring device according to claim 4, wherein
the detection element is configured such that a detection surface of the detection element is located at a position where a reflected light ray from the object to be measured arranged at the first height and a reflected light ray from the object to be measured arranged at the second height arrive.

7. The height measuring device according to claim 1, wherein
the adjustment element matches a focusing condition of one light ray of the light rays split into a plurality of parts by the light splitting element with respect to the object to be measured with a focusing condition with respect to the other light ray and is disposed in an optical path of the one light ray.

8. The height measuring device according to claim 1, wherein
the adjustment element makes a length of one optical path of the light ray divided into a plurality of parts extend further than a length of the other optical path and is disposed between the light source and the object to be measured.

9. The height measuring device according to claim 8, wherein
the adjustment element is an optical element which extends the length of the one optical path by an Optext1, and the Optext1 is obtained by the following equation:

$$\text{Optext1} = WD/\cos\theta \qquad \text{(Equation)}$$

WD: Difference in height between the object to be measured at a first height and the object to be measured at a second height, and
θ: Relative angle between the normal line to the surface of the object to be measured and the optical path of the light ray.

10. The height measuring device according to claim 1, wherein
the correction element makes a length of one optical path of a plurality of reflected light rays of the light ray divided into a plurality of parts extend further than a length of the other optical path.

11. The height measuring device according to claim 1, wherein
an element for focusing a plurality of reflected light rays reflected from the object to be measured on one position of the detection element is disposed between the object to be measured and the detection element.

12. The height measuring device according to claim 1, wherein
the detection optical system includes a first detection optical system including a first detection element for detecting a reflected light ray of a first light ray obtained by projecting the divided light ray onto the object to be measured and a second detection optical system including a second detection element for detecting a reflected light ray of a second light ray, and the second detection optical system includes a mirror which reflects the reflected light ray of the second light ray to reach the second detection element.

13. A beam irradiation device, comprising:
a sample stage configured to place an object to be measured;
a beam irradiation optical system configured to irradiate the object to be measured placed on the sample stage with a beam and including a lens for focusing the beam;
a projection optical system configured to project a light ray onto the object to be measured;
a detection optical system including a detection element configured to detect a reflected light ray from the object to be measured;
a control device configured to control the lens so as to adjust a focus of the beam based on an output of the detection element;
an adjustment element disposed lengthwise along a projection direction of the light ray projected by the projection optical system and between the projection optical system and the object to be measured, and including a smooth flat light incident surface and a smooth flat light emission surface which are parallel to each other; and
a correction element disposed lengthwise along a direction of the reflected light ray reflected from the object to be measured and between the object to be measured and the detection optical system, and including a smooth flat light incident surface and a smooth flat light emission surface which are parallel to each other, wherein
a length of the adjustment element is longer than a length of the correction element,
the projection optical system includes a light splitting element which splits a trajectory of the light ray with which the object to be measured is irradiated into a plurality of parts, and
the detection optical system includes a double-sided wedge substrate configured to focus a plurality of trajectories of the light ray into one point on the detection element, the double-sided wedge substrate including a first surface through which a first trajectory of the light ray is transmitted and a second surface, different from the first surface, through which a second trajectory, different from the first trajectory, of the light ray is transmitted.

14. The beam irradiation device according to claim 13, comprising:
a drive mechanism for moving the sample stage in a normal line direction of a surface of the object to be measured.

15. The beam irradiation device according to claim 14, wherein
the drive mechanism is configured to move the sample stage so that the object to be measured is located at least at a first height and a second height different from the first height, and
the projection optical system is configured such that a position of an irradiation point of a light ray with respect to the object to be measured when the object to be measured is located at the first height coincides with a position of an irradiation point of a light ray with respect to the object to be measured when the object to be measured is located at the second height.

16. The beam irradiation device according to claim 13, wherein
the adjustment element matches a focusing condition of one light ray of the light rays split into a plurality of parts by the light splitting element with respect to the object to be measured with a focusing condition with respect to the other light ray and is disposed in an optical path of the one light ray.

17. The beam irradiation device according to claim 13, wherein
the adjustment element makes a length of one optical path of the light ray divided into a plurality of parts extend further than a length of the other optical path is disposed between a light source and the object to be measured.

18. The beam irradiation device according to claim 17, wherein
the adjustment element is an optical element which extends the length of the one optical path by an Optext1, and the Optext1 is obtained by the following equation:

$$\text{Optext1} = WD/\cos\theta \qquad \text{(Equation)}$$

WD: Difference in height between the object to be measured at a first height and the object to be measured at a second height, and
$\theta$: Relative angle between the normal line to the surface of the object to be measured and the optical path of the light ray.

19. A height measuring device, comprising:
a sample stage configured to place an object to be measured;
a drive mechanism for moving the sample stage in a normal line direction of a surface of the object to be measured;
a projection optical system configured to project a light ray onto the object to be measured;
a detection optical system including a detection element configured to detect a reflected light ray from the object to be measured;
a processing device configured to measure a height of the object to be measured based on an output of the detection element;
an adjustment element disposed lengthwise along a projection direction of the light ray projected by the projection optical system and between the projection optical system and the object to be measured, and including a smooth flat light incident surface and a smooth flat light emission surface which are parallel to each other; and
a correction element disposed lengthwise along a direction of the reflected light ray reflected from the object to be measured and between the object to be measured and the detection optical system, and including a smooth flat light incident surface and a smooth flat light emission surface which are parallel to each other, wherein
a length of the adjustment element is longer than a length of the correction element,
the projection optical system includes a switching element configured to switch a trajectory of the light ray with which the object to be measured is irradiated, and the switching element is configured to switch the trajectory of the light ray so as to make a position of an irradiation point of a light ray when the object to be measured is positioned at a first height coincide with a position of an irradiation point of a light ray with respect to the object to be measured when the object to be measured is positioned at a second height different from the first height with the drive mechanism, and
the detection optical system includes a double-sided wedge substrate configured to focus a plurality of trajectories of the light ray into one point on the detection element, the double-sided wedge substrate including a first surface through which a first trajectory of the light ray is transmitted and a second surface, different from the first surface, through which a second trajectory, different from the first trajectory, of the light ray is transmitted.

* * * * *